United States Patent [19]
Corbin et al.

[11] Patent Number: 5,741,557
[45] Date of Patent: Apr. 21, 1998

[54] METHOD FOR DEPOSITING METAL FINE LINES ON A SUBSTRATE

[75] Inventors: Antoine Corbin, Paris; Philippe Demoncy, Evry; Jacques Foulu, Lesigny; Pierre Sudraud, Dourdan, all of France

[73] Assignee: International Business Machines Corporation, Armonk, N.Y.

[21] Appl. No.: 448,689

[22] Filed: May 24, 1995

Related U.S. Application Data

[62] Division of Ser. No. 261,645, Jun. 17, 1994.

[30] Foreign Application Priority Data

Jul. 30, 1993 [EP] European Pat. Off. ............ 93480106

[51] Int. Cl.$^6$ .................... B06B 1/00; H05B 3/00; H05B 7/00; B05D 5/12

[52] U.S. Cl. .................... 427/469; 427/580; 427/592; 427/600; 427/96; 427/123; 427/261; 427/265; 427/269; 164/492; 164/495; 164/488; 164/489; 164/501

[58] Field of Search .................... 427/592, 594, 427/580, 565, 600, 420, 96, 123, 265, 269, 428, 430.1, 431, 435, 443.2, 458, 469, 266, 261; 164/495, 501, 469, 489, 488, 492

[56] References Cited

U.S. PATENT DOCUMENTS

| | | | |
|---|---|---|---|
| 1,767,607 | 6/1930 | Moulthrop | 219/221 |
| 3,103,067 | 9/1963 | Dixon | 427/565 |
| 3,222,776 | 12/1965 | Kawecki | 164/501 |
| 3,628,982 | 12/1971 | Krug | 118/263 |
| 3,711,211 | 1/1973 | Garrison | 401/2 |
| 3,821,513 | 6/1974 | Christensen | 219/233 |
| 4,208,145 | 6/1980 | Azuma | 401/196 |

(List continued on next page.)

FOREIGN PATENT DOCUMENTS

| | | |
|---|---|---|
| 0096433 | 5/1983 | European Pat. Off. . |
| 0491599A1 | 12/1991 | European Pat. Off. . |
| 2308189 | 8/1974 | Germany . |
| 3612341 A1 | 10/1987 | Germany . |
| 4288953 | 10/1992 | Japan ............ 164/489 |

OTHER PUBLICATIONS

J. P. Ibe, et al., "On the electrochemical etching of tips for scanning tunneling microsopy" J. Vac. Sci. Technology, A8 (4), pp. 3570–3575, Jul./Aug. 1990.

MICROPEN Brochure, "CAD/CAM Orifice Writing System for Thick Film and Other Materials", MICROPEN Inc., 265 Thornell Rd., Pittsford NY 14534. no date.

Primary Examiner—Marianne Padgett
Attorney, Agent, or Firm—H. Daniel Schnurmann

[57] ABSTRACT

A method for forming a desired pattern of a material of conductive or non-conductive type on a variety of substrates. It is based on the use of a pen which essentially consists of a refractory tip wetted with the material in the molten state. The pen preferably consists of a pointed tungsten tip attached to the top of a V-shaped tungsten heater, forming a heater assembly. The tip and the heater top portion are roughened at the vicinity of the welding point. In turn, the ends of the V-shaped heater are welded to the pins of a 3-lead TO-5 package base. The pen is incorporated in an apparatus adapted to the direct writing technique. To that end, the pen is attached to a supporting device capable of movements in the X, Y and Z directions, while the substrate is placed on an X-Y stage for adequate X, Y and Z relative movements therebetween. The two pins of the pen are connected to a power supply to resistively heat the heater. When the welding point of the tip/heater assembly reaches the melting point of the material to be deposited, it is dipped in a crucible containing the material in the molten state. The welding point nucleates a minute drop of the liquid material, thus forming a reservoir. A thin film of the liquid material flows from the reservoir and wets the tip. Finally, the wetted tip is gently brought into contact with the substrate and deposition of the material takes place to produce the desired pattern.

18 Claims, 6 Drawing Sheets

U.S. PATENT DOCUMENTS

| | | | |
|---|---|---|---|
| 4,255,643 | 3/1981 | Balfanz | 228/45 |
| 4,283,443 | 8/1981 | Choinski | 427/434.2 |
| 4,451,503 | 5/1984 | Blum et al. | 427/53.1 |
| 4,458,628 | 7/1984 | Fujii et al. | 118/697 |
| 4,539,089 | 9/1985 | Binning | 427/431 |
| 4,564,410 | 1/1986 | Clitheros et al. | 118/697 |
| 4,572,103 | 2/1986 | Engel | 118/697 |
| 4,584,964 | 4/1986 | Engel | 118/697 |
| 4,606,492 | 8/1986 | Guslits | 228/179 |
| 4,646,676 | 3/1987 | Kidder et al. | 118/263 |
| 4,661,368 | 4/1987 | Rohde et al. | 118/669 |
| 4,692,351 | 9/1987 | Maeda et al. | 118/410 |
| 4,723,086 | 2/1988 | Leibovich et al. | 269/21 |
| 4,743,465 | 5/1988 | Saeki et al. | 118/411 |
| 4,770,633 | 9/1988 | Ueno | 433/32 |
| 4,862,827 | 9/1989 | Getson | 118/620 |
| 4,871,899 | 10/1989 | DuFrenne | 219/233 |
| 4,959,112 | 9/1990 | Ellis, Jr. et al. | 156/248 |
| 5,049,404 | 9/1991 | Kisler et al. | 427/600 |
| 5,084,305 | 1/1992 | Marttila | 427/434.2 |
| 5,099,090 | 3/1992 | Allan et al. | 118/411 |
| 5,159,171 | 10/1992 | Cook et al. | 219/121.63 |
| 5,186,982 | 2/1993 | Blette et al. | 427/256 |
| 5,238,050 | 8/1993 | Folder et al. | 164/489 |
| 5,262,163 | 11/1993 | Louks et al. | 427/600 |
| 5,262,617 | 11/1993 | Higashiguchi | 219/221 |
| 5,520,715 | 5/1996 | Oeflering | 427/600 |

METHOD FOR DEPOSITING METAL FINE LINES ON A SUBSTRATE

This is a divisional of the patent application Ser. No. 08/261,645, filed Jun. 17, 1994.

FIELD OF THE INVENTION

The present invention relates to a method for depositing various materials of a conductive or non conductive type on a substrate. It more particularly relates to a method for directly writing at high speed, a thick conductive pattern metallic on the substrate, based on the use of a pen provided with a refractory tip wetted with metal in a molten state.

BACKGROUND OF THE INVENTION

The use of a thin pointed tip to form ultra-fine metal lines have found wide application in VLSI semiconductor integrated circuit (IC) chips.

Conventional methods have been used thus far to form patterns of conductive material on a substrate in connection with the fabrication or repair of semiconductor IC chips. Indeed, it is often necessary to form conductive patterns with superior resolution on a semiconductor structure during the various phases of the chip fabrication. Such patterns provide the necessary contacts, electrodes, and conductors (or lines) that are required to meet the various connection/interconnection needs. Conductive materials include doped polysilicon, low melting point metals such as aluminum (Al), metal alloys such as aluminum-silicon (Al-Si), gold-silicon (Au-Si), and refractory metals such as tungsten (W), tantalum (Ta), and chromium (Cr). However, low melting point metals and metal alloys are by far, the most ubiquitous materials used throughout the semiconductor industry.

A typical method of forming metal patterns is to combine lithography and deposition techniques. E-beam evaporation or sputtering deposition and lift-off lithography are the standard techniques used to date. Typically, a thick photoresist layer is first formed onto a semiconductor structure. The resist is then exposed using a photomask. This exposure serves to trace a predetermined pattern in the resist inducing localized chemical reactions in the exposed regions. The resist layer is then developed in a suitable solvent and the exposed regions (in case of a positive resist) are removed. Next, a metal layer is blanket sputtered onto the structure and the remaining portions of the resist layer are removed, leaving the desired complementary metal pattern on the surface of the structure.

The above described method is extensively used in the industrial production of semiconductor IC chips. However, it has some significant limitations for customizing and repairing chips. The conventional method described above, however, is still used in customizing (or personalizing) CMOS gate arrays. For instance, eight out of the twelve photomasks of a typical CMOS process are generic. However, there is a strong demand for fast turn-around of prototypes, small production volumes and significant engineering support in the chip design and evaluation stages, all of which put pressure on gate array manufacturers. Obviously, lithography is hard pressed to cope with the short delays demanded by the marketplace to produce a customized chip or to repair a defective chip. As a result, the above described method cannot be used for instant customizing of ASICs (Application Specific Integrated Circuits) or for chip repair.

Other conventional methods have been successfully used to form patterns of an opaque material in connection with the manufacture of photomasks, but they usually use other lithographic techniques. By way of example, according to a typical fabricating photomask process, a metal (usually chromium) coated transparent glass plate is first covered with a radiation sensitive resist layer. The resist is exposed using a well collimated E-beam and developed. The remaining patterned resist layer acts as a protective layer to the underlying metal coating. In turn, the unprotected metal is etched up to the glass plate. Finally, the remaining resist layer is removed, leaving opaque zones of metal on the glass plate surface. As known to those skilled in the art, photomasks are currently used in the lithographic steps in the course of IC chip manufacture. As far as the fabrication of photomasks is concerned, this lithographic process tends to develop two groups of defects: unwanted portions are left unremoved (so-called black-spot defects) and portions needed are unintentionally etched away (so-called clear or white-spots defects). This method is extensively used in the industrial production of photomasks, but it is clearly not applicable for repair purposes. Using an additional lithographic step to repair a defective mask by performing localized metal deposition thereon makes little or no sense, and more often than not, a new mask is produced.

In summary, lithographic based methods are well adapted to mass producing semiconductor IC chips or photomasks, but are not suited for applications involving small volume production of IC chips, customizing and repair, and mask repair. In addition, lithography has an inherent high capital and operating cost, due to the sophisticated E-beam or photoaligner apparatus that are required to trace a pattern. As a result, alternate methods eliminating lithographic steps during prototyping and engineering have been sought to improve flexibility and save time and expense.

Two recent techniques, known under the name of Focused Ion Beam (FIB) and its variant Focused Ion Beam-Chemical Vapor Deposition (FIB-CVD), obviate most of the drawbacks of above the conventional lithographic processes described. In particular, they are adaptable to the ablation of metal fine lines and to the deposition of metal fine lines, respectively. Consequently, they have found a wide application in various fields of the semiconductor technology, particularly, in the repair of IC chips and masks as well as other related fields, such as process monitoring, defect/failure analysis, device evaluation, sample preparation for microscopy and micro-analysis, and the like. To date, the FIB-CVD is considered the most promising deposition technique, and it is on the verge of significant and rapid advances in the semiconductor industry.

In a standard configuration adapted to metal deposition, a FIB-CVD station is housed within a column-shaped vacuum chamber that includes an X-Y stage capable of controlled movements in the X-Y directions of an horizontal plane. The column encloses a high brightness liquid metal ion source which consists of a sharp needle wetted by a film of the metal, typically gallium (Ga) in its molten state. The molten metal travels by capillary action to the needle of the ion source where it is ionized. An extraction electrode having a difference voltage potential with the ion source extracts the ion beam from the source. There is produced a beam of charged particles, i.e. ions, that appears to emanate from a point. A ExB mass separator can be used to select only the desired ion species and deflect the undesired species out of the beam (as for instance, when metal alloy is used). A series of lenses is placed on the path of the ion beam to provide focus. Next, a beam deflector is used to scan the beam over the substrate. The substrate which forms the target for the FIB is generally placed on top of a heating element affixed on the X-Y stage. A thermo-couple sensor senses the substrate temperature, thereby providing control to the heating element. The substrate is heated to a temperature sufficiently high to support growth of the desired material. The compound which includes the material to be deposited on the substrate is held in a gaseous state within a reservoir. A gaseous organometallic compound such as tungsten carbonyl is typically used as a working gas. A valve controls the flow of the working gas from the reservoir through a nozzle which terminates in close proximity of the substrate, and directs a flow of gas onto the desired portion thereof. A few atomic layers of the working gas are adsorbed by the substrate surface.

The focused ion beam generated by the liquid metal ion source is projected onto the substrate and scanned thereon by the beam deflector so that the working gas is decomposed. The tungsten film is only formed in an area where the ion beam impinges on the gas. Metal fine lines are formed continuously. The focused ion beam is scanned along a predetermined locus, corresponding to a desired circuit connection line (preferably in multiple scans) to grow the metal until the desired thickness is obtained. This is clearly a lengthy process, and since the ion beam intensity can only be increased to a limited extent, it is rather difficult to trace relatively long lines, e.g., 1 mm, unless one is willing to accept an appreciable loss in terms of resolution. The secondary electrons emitted from the surface of the substrate are detected, amplified and processed for final display on an appropriate display as a high resolution SIM (Scanning Ion Microscope) image. Since a control unit drives the X-Y stage, it is possible to observe the SIM image of any desired portion of the substrate—a significant advantage for chip or mask repair.

The FIB-CVD station previously described is particularly well suited to perform additive processes, such as deposition of metals. However, it suffices not to use the working gas to transform the station into an equipment that is adapted for subtractive operations, such as etching (reverse sputtering), hole drilling, wire cutting, etc. As a result, the FIB and FIB-CVD techniques can lead to various and interesting applications. By way of example, although the FIB-CVD technique has limited use in the manufacture of IC chips to form electrical connections (wherein active and passive devices have been previously formed by appropriate lithography and implantation steps), it is widely used for repairing such chips. If there is an open in a metal interconnect line that was previously deposited (as a result of a manufacturing defect), the line can be repaired by scanning the open area to deposit new metal and fill the open as described above.

According to the FIB-CVD technique, no limitations exist in the nature of metals to be deposited. For instance, refractory metals, including tungsten, which have a high melting point temperature (of about 3370° C.), are easily deposited on an insulating or a silicon substrate, when using metal carbonyl compounds. However, deposition of such refractory metals is more difficult when GaAs is the semiconductor material, because GaAs is not easily oxidized and metallized. This disadvantage has severely hampered the development of this technology to this date. For example, refractory metal gate electrodes are currently applied to GaAs MESFET devices by sputtering and E-beam evaporation. In both of these processes, damage can occur to the GaAs surface. Sputtering causes impact damage, and E-beam evaporation results in dissociation of GaAs. The preferred method of depositing refractory metals, is a variant of the FIB-CVD technique described above, the so-called photodeposition. As disclosed, for instance, in U.S. Pat. No. 4,451,503 assigned to IBM, photodeposition uses ultraviolet radiation of wavelengths less than 200 nm to photodecompose the gaseous metal carbonyl compound in the vicinity of the GaAs wafer.

For similar reasons, the FIB/FIB-CVD techniques are not well adapted to the manufacture of masks, to form opaque chromium patterns on a glass plate. They have found wider applications in repairing masks, either by depositing new metal on white spot defects that develop in the mask pattern or by ablation of undesired metal portions thereof. Again, in this instance, the SIM image is helpful in pinpointing the exact location of the mask defects to be repaired. Moreover, as mentioned above, it is rather simple to transform the FIB-CVD station into a FIB station adapted to eliminate by ablation the undesired shorts at the surface of the IC chips.

In summary, the FIB/FIB-CVD techniques have numerous applications, including the in-situ formation of metal patterns to be used as circuit connections during the repair or personalization of an IC chip, as well as for the formation of additional opaque patterns during the repair of photomasks. Unfortunately, in particular, the FIB-CVD pattern forming process has some significant drawbacks, as will be explained hereinafter.

In order to obtain good resolution, a low ion beam intensity is required, which in turn implies a ion beam having a very small size diameter size, e.g. 30–40 nm. To create a 2 µm×1 µm conductor thus requires multiple scans. The requirement of a relatively high ion dose and an ion beam that must be left on the substrate during the entire deposition process, multiple scans of the line to be deposited significantly slow down the speed at which lines are written. Furthermore, the rate of line (or pattern) build-up to a desired thickness is very low.

Since a chemical deposition is used during the manufacturing process, the resulting resolution is naturally poor. Any attempt to raise the build-up rate mentioned above requires increasing the ion beam intensity, thereby causing the ion beam to become unfocused. This, in turn, results in spreading away the sputtered material excessively.

High resistivity conductors can also be obtained. Impurities, typically, carbon and gallium atoms, are implanted during the pattern formation. When ultra-fine lines are required, the impurity level of the deposited lines may be high, i.e., in excess of 25%, thereby resulting in a sheet resistivity which is much higher than desired. As a result, for the reasons stated, the FIB-CVD technique is limited to the deposition of relatively short lines. Long lines are too resistive and also require too much time.

Organometallic products, such as tungsten carbonyl $W(CO)G$, molybdenum carbonyl $Mo(CO)G$, chromium carbonyl $(Cr(CO)G$, and the like, are extensively used in FIB-CVD but can lead to the formation of dangerous and toxic compounds.

A conventional FIB-CVD station is relatively complicated and expensive and has a high operating cost. It further requires operating in a vacuum environment. Generally, the FIB-CVD station is placed in the vacuum chamber of a scanning electron microscope (SEM).

The FIB-CVD process requires relatively high dosage, in the order of $10^{17}$ ions/cm$^2$ or greater to deposit patterns or lines that are only a few hundred nanometers thick. The use of such high dosage can result in damage of the wafer surface.

The deposition step requires high temperatures (e.g., 300° C.) to heat the substrate. Should the substrate be a semiconductor wafer, the presence of elevated temperature can result in detrimental phenomenon within the devices integrated therein which could alter the electrical characteristics of the device.

High aspect ratios are achieved with the FIB-CVD technique. A common problem is attributable to the sharp step of conductors that are formed, while in most instances, conductors having tapered edges would have been preferred to avoid the step coverage effect with its well known reliability problems. Thus, although ion beams can be focused to below a micron in diameter and thus have the potential for sub-micron resolution, a practical way to integrate rapid and efficient metal line deposition into an IC chip manufacture and repair process has not been found thus far. As a result, there still remains the pressing need for a new technique that includes a maximum of advantages of the FIC-CVD deposition technique (possibly by introducing functions not performed by the same), while retaining only a minimum of its disadvantages. Moreover, it should also be adapted to provide some of the subtractive features of the FIB technique. Finally, it would be highly desirable to have this technique adapted to the fabrication of IC chips, so that a mask free fabrication of IC chips with no lithography steps could be envisioned. This technique should also be adaptable to customizing and repairing IC chips and masks, as presently FIB-CVD and FIB techniques are capable of achieving.

Accordingly, it is a primary object of the present invention to provide a method for depositing materials of either a conductive and non conductive type on a variety of substrates.

It is another object to provide a method for the direct writing of a desired conductive pattern on a substrate having either a regular or irregular surface.

It is another object to provide a method for depositing a metal pattern on a substrate to form electrical connections at relatively high speed.

It is another object to provide a method for depositing a metal pattern on a substrate to form electrical connections having precise dimensions.

It is another object to provide a method for depositing a metal pattern on a substrate to form electrical connections with a resistivity equivalent to the bulk metal.

It is another object to provide a method for depositing a metal pattern on a substrate to form electrical connection lines of any desired length and width.

It is another object to provide a method for depositing a metal pattern on a substrate that does not use toxic compounds.

It is another object to provide a method for depositing a metal pattern on a substrate that requires a relatively inexpensive equipment with a low operating cost.

It is another object to provide a method and apparatus for depositing a metal pattern on a substrate that is capable to fill via-holes formed in the substrate.

It is still another object to provide a method for depositing a metal pattern on a substrate without damaging the surface of the substrate.

It is still another object to provide a method for depositing a metal pattern on a substrate that can be normally performed at room temperature.

It is still another object to provide a method for depositing a metal pattern on an insulating substrate, whose lines have tapered edges and rounded corners for improved reliability.

It is still another further object to provide a method for depositing a pattern of a refractory metal on a GaAs substrate.

It is still another further object to provide a method normally constructed for depositing conductive and non conductive materials on a substrate that can be easily adapted to a subtractive process, such as scribing and electroerosion.

It is still another further object to provide a method for depositing successive metal and insulator patterns on a substrate that could lead to a totally mask-free fabrication of IC chips.

It is still another further object to provide a method for depositing a metal pattern on a substrate that is adapted to the personalization and repair of IC chips and photomasks.

These and other objects will be accomplished by the method of the present invention by directly writing a desired pattern of a given material on a substrate. It is based on the use of a pen or writing head, preferably consisting of a refractory tip wetted in material in a molten state. The tip is formed by a small wire, typically of refractory metal such as tungsten, that has been electrolytically sharpened and roughened. The tip is attached, preferably by micro welding, to the top of a heater, which typically consists of a V-shaped piece of the same tungsten wire. Each end of the V-shaped heater is welded to a pin that emerges from an insulating base support, e.g., a 3-lead TO-5 package, with three pins partially casted therein. The pen is incorporated into an apparatus adapted for direct writing. The tip is attached to a supporting device, preferably adapted to move along the Z-axis, while the substrate moves on an X-Y stage, for X, Y, and Z relative movements therebetween. The two pins of the pen are connected to a power supply to resistively heat the heater. When the welding point of the tip/heater assembly reaches the melting point of the material to be deposited, it is dipped in a crucible containing material in the molten state. The welding point nucleates a minute drop of liquid material and forms a spatial reservoir in the absence of any container. A thin film of the liquid material flows from the reservoir and wets the tip surface. Finally, the wetted tip is gently brought into contact with the substrate and deposition of the material takes place. Physical contact between the tip apex and the substrate surface is not required, which helps limit the wear of the tip. Preferably, the tip/heater assembly is vibrated to facilitate deposition of the material. Alternate configurations of the tip may be used to create different patterns. For instance, ultra-fine lines of metal can be formed to define the electrical connections of an IC chip, or larger zones of opaque material in the repair of a mask.

In essence, the deposition method of the present invention consists in the direct writing of a material on a substrate using a tip wetted in the material in a molten state. These materials can either be of a conductive type including standard metals (Al), metal alloys (Al-Si, Au-Si, . . . ), or refractory metals (Cr, Ta, . . . ) or of a non-conductive type, such as organic or non-organic insulators. The substrate may be selected from a variety of supports and may encompass either a planar or non-planar surface. Moreover, with the method of the present invention, a mask free manufacture of semiconductor IC chips, and, particularly, of the III-V type, is henceforth possible. The deposition method of the present invention has numerous advantages and applications not only in the semiconductor technology field but in other fields as well.

BRIEF DESCRIPTION OF THE DRAWINGS

The features believed to be characteristic of this invention as well as other objects and advantages thereof will be best understood by reference to the following detailed description of a preferred embodiment in conjunction with the accompanying drawings, in which.

DESCRIPTION OF THE PREFERRED EMBODIMENT

Figure 1:
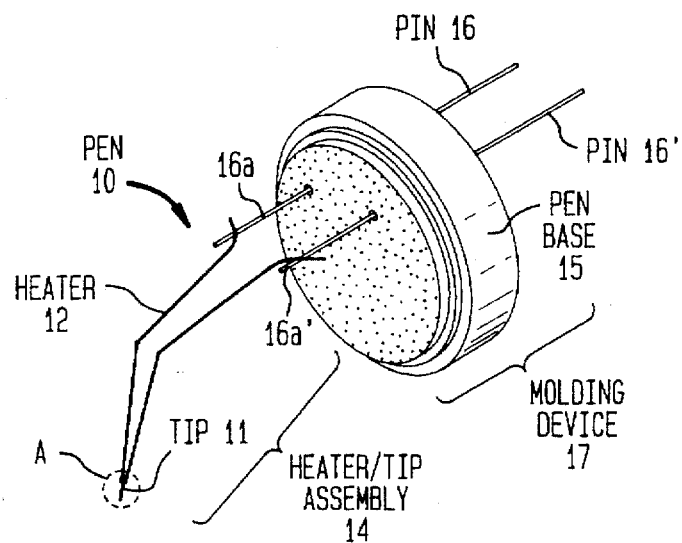
FIG. 1 is a schematic diagram of the pen according to the teachings of the present invention.

As illustrated by FIG. 1, the pen 10 basically consists of a tip 11 formed by a small pointed segment of refractory metal, such as tungsten, that has been sharpened and roughened (for better wetting in the material to be deposited) according to an electrolytic process to be described below. The tungsten tip 11 is attached, preferably, by welding, to the top of a V-shaped tungsten wire, referred to hereinafter, as the heater 12. The welding point and the tip/heater assembly are respectively referenced by numerals 13 and 14. A standard 3-lead TO-5 package base 15 including two pins 16 and 16' is used as the holding device for tip/heater assembly 14. The other two ends of the V-shaped heater 12 are welded to the ends 16a and 16'a, respectively of pins 16 and 16' that emerge at about 3 mm of the base 15 surface. The free ends of the pins are ready for connection to a power supply so as to resistively heat the tip/heater assembly when the pen is mounted. Referring now to the process of fabricating the heater/tip assembly 14, a preferred material for the fabrication of the tip 11 and heater 12, is a 0.1 mm diameter tungsten wire, supplied by MOLYTECH, Meribel, France. The tip and the heater assembly can be fabricated using other materials but are restricted to those having a melting temperature higher than the melting temperature of the material to be deposited and which is capable to be wetted therewith. In addition, no chemical incompatibility should exist between the material forming the tip and the material to be deposited. The V-shaped heater 12 is formed by folding a small segment of wire typically with each side or leg of the V-shaped wire being approximately 1.5 cm long. As apparent from FIG. 1, the top of the V is slightly tilted with respect to its legs, to form a 45° angle therewith, approximately at a distance two-thirds from the top. Then, a 2 mm long segment of the same tungsten wire, that had been previously coarsely cut with cutting pliers, is welded at the top of the V, at point 13, to form the tip 11. In turn, the ends of the heater 12 opposite to the top are welded to the pin ends 16a and 16'a. An electrolytic process is then performed to sharpen the tip on about half its length and to roughen the tip and the top portion in close vicinity of the welding point 13 (a few millimeters from the tilted portion). The tip is roughened for better wetting in material in molten state. However, selected materials such as Au-Si alloys can wet the tip without this requirement. Likewise, the top portion of the heater is also toughened to facilitate the formation of a drop of molten material, as will be described hereinafter.

Figure 2A:
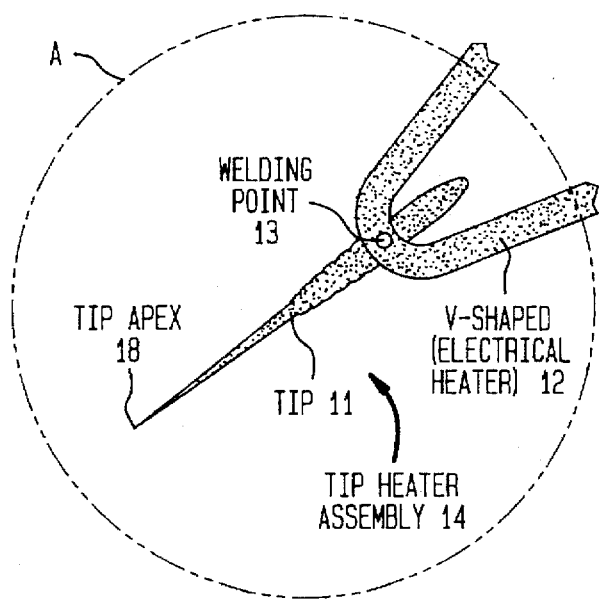
FIG. 2A is a schematic diagram showing an enlarged view of the tip/heater assembly of the pen of FIG. 1.

By way of example, sharpening and roughening may preferably be obtained according to the following processing steps. The tip is dipped in an electrolytic bath comprised of a NaOH and glycerol solution (8 g NaOH/100 ml glycerol) kept at about 40° C. Its coarsely cut end is eliminated by applying a 20 V AC voltage between the electrode and the tip. The remainder of the tip (about 1 mm) is dipped again in the same solution, but now the variable voltage is lowered from about 15 to about 5 V, and is applied for about 90 seconds to sharpen the tip and obtain the desired shape and apex radius. Finally, the tip and heater top portion are etched to provide the desired rugosity. To that end, they are dipped in the solution having low tension, e.g., 1 V for a few seconds, e.g., 1 to 3 seconds, to create the necessary pitfalls. The resulting structure is illustrated in FIG. 2A, which shows an enlarged view of the tip/heater assembly 14. FIG. 1 clearly shows the typical needle-shaped profile of the tip and the roughened surface of the tip and heater top portion. In regard to the electrolytic process, technical background may be found in an article authored by J. P. Ibe et al., in the Journal of Vacuum Science and Technology A, 4, 3570 (1990).

Referring now to FIG. 2A, the tip apex labelled 18 has a radius is about 1 µm. In a typical application to the forming of ultra-fine lines of metal for VLSI IC chips, a tip apex radius of approximately 0.5 to 2 µm is generally adequate. In reality, the apex radius is not a critical parameter of the tip since no physical contact between the tip 11 and the substrate is required.

Figure 2B:
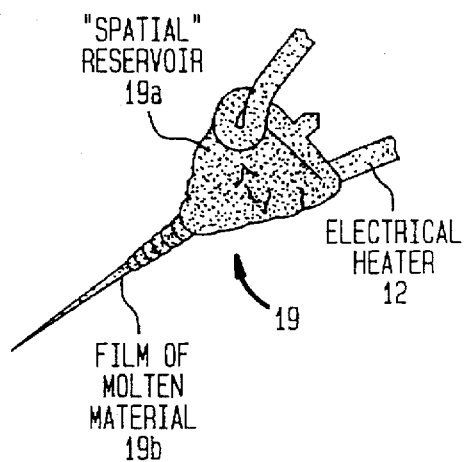
FIG. 2B is a schematic diagram showing the tip/heater assembly of FIG. 2A when wetted in a molten material.

A method of wetting the tip with the material in the molten state will now be described. The heater/tip assembly 14 (near the welding point 13) is heated until it reaches the melting point of the material to be deposited. The assembly is then dipped in a crucible containing the material in its molten state. Surface tension forces induce the welding point 13 to nucleate into a minute drop or bullet of molten material forming a "spatial" reservoir 19a. From reservoir 19a, the liquid material flows to form a film 19b that wets the whole tip 11. The reservoir and film form a continuous flow of molten material whose contour is visible, under reference 19, in FIG. 2B. It is worth noticing that the reservoir 19a does not require the container to store any material.

There is no apparent physical limitations of the diameter of the tip. The tip of the present invention can be used in fields such as the semiconductor and packaging technology. Other technical fields may be envisioned as well. For instance, tip diameters in the range of 0.5 to 2 µm can be used to fabricate conductors of standard devices that are integrated in a VLSI semiconductor IC chip. Smaller tip diameters, in the range of 10–100 nm, can be used to fabricate other types of integrated or quantum devices. Conversely, the extension towards tips of larger diameters (e.g., 10–1000 µm) is readily feasible. Such tips can find applications in the manufacture of metallized ceramic (MC) and multi-layer ceramic (MLC) substrates. Although a needle-shaped tip has been described in this preferred embodiment, by reference to FIGS. 2A and 2B, this design should not be interpreted limitatively. Other pointed tip shapes may be envisioned as well such as post-shaped, doctor blades, brush-like tip structures, and the like. As a matter of fact, the nature of the refractory material forming the tip, its length, shape, and other parameters, depend upon a specific application. Moreover, different designs or variances of the tip/heater assembly 14 may be contemplated. For instance, instead of being V-shaped, the heater may be shaped into a coil (which significantly increases the reservoir capacity). Likewise, the tip may be inserted in a thin capillary tube connected to a source of liquid material (for automatic feeding of the tip).

Figure 3:
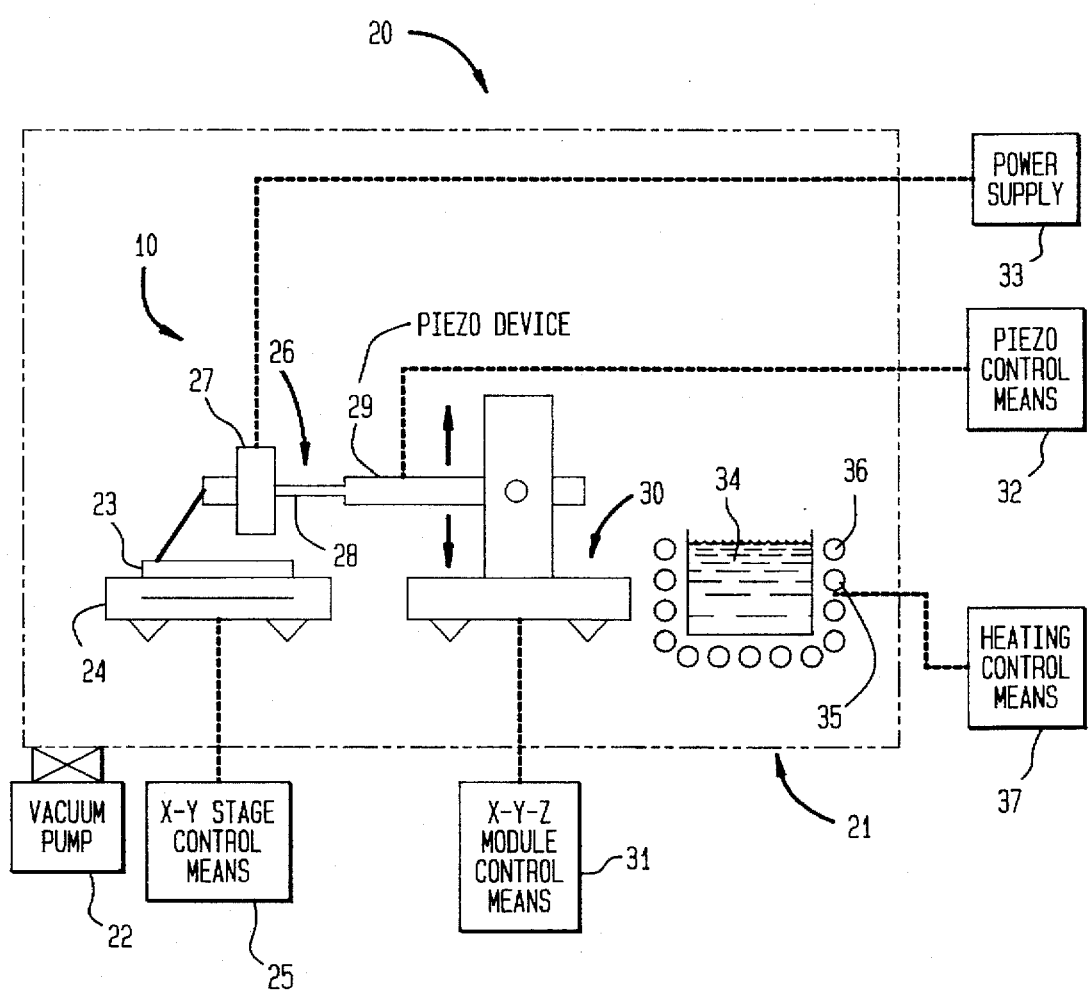
FIG. 3 illustrates a schematic diagram of the apparatus of the present invention.

The apparatus which incorporates the pen 10 of the present invention is schematically depicted in FIG. 3 where it bears numeral 30. According to a preferred embodiment, apparatus 20 comprises a vacuum chamber 21 connected to a vacuum pump 22. The substrate 23 is carried by an X-y stage or table 24 whose movements are controlled by a conventional control 25. The holding device 17 of pen 10 is attached to a supporting frame 26 which, preferably, includes an annular plastic part 27 adapted to receive the base 15 of pen 10 on one face, the free ends of pins 16 and 16' of pen 10 emerging on the other. The latter is provided with a central recess adapted to receive the first end of an arm 28 forcibly engaged therein. The second end of an arm 28 is affixed by a screw to the strip of a piezo device 29. Finally, the piezo device 19 is mounted on module block 30 to terminate construction of the supporting frame 26. For instance, appropriate piezo devices are available by Tokin Corp., Tokyo, Japan, under reference NLA 2×3×18. The module block 30 can move the pen 10 in the X, Y and Z directions by means of a three-stepping motors (optionally module block may also rotate the pen) under the guidance of control 31. The Z direction stepping motor allows coarse adjustment of the spacing distance or gap between the wetted tip and the substrate, just to come within the effective range (about 1 mm) of the piezo device. The role of the piezo device 29 is to complete the fine adjustment of the spacing distance when the wetted tip is brought into contact with the substrate. In addition, it is preferably designed to cause vibrations of the tip along the Z direction. The piezo device 29 is driven under control of the piezo control 32. These vibratory movements may be mandatory in certain situations, e.g., to overcome surface irregularities (such as micro-stairs), to fill via-holes or to initiate the deposition process. On planar substrate surfaces, these vibratory movements are generally not required, but generally, they facilitate the deposition process X-Y stage 24 and module block 30 are standard parts which are commercially available, as for instance, from RAITH GMBH, Dortmund, Germany. The two pins 16 and 16' of pen 10 are connected to power supply 33 for resistively heating the tip/heater assembly 14. Those skilled in the art will readily appreciate that the X, Y and Z motion of pen/substrate assembly can be achieved in a variety of manners. The material 34 in the molten state is contained in a crucible referenced 35, provided with a heating coil 36 and associated temperature control 37. The crucible is designed so that the pen dipped therein is fed into the reservoir 19a to decontaminate the tip. There is no apparent need to implement an automatic feeding system, because of the capacity of the reservoir and the extremely small quantity of material that is required for deposition. As a matter of fact, the capacity of the reservoir 19a (shown in FIG. 2B) is about 1 mm$^3$, assuming the material to be deposited to be metal. This capacity would allow writing about 1 km of a 1 µm×1 µm conductive line. Alternatively, the pen may be supplied to the user with a pre-filled reservoir, so that the pen is ready at once, in which case, it suffices to heat the reservoir to have the tip wetted within a few seconds.

Figure 4:
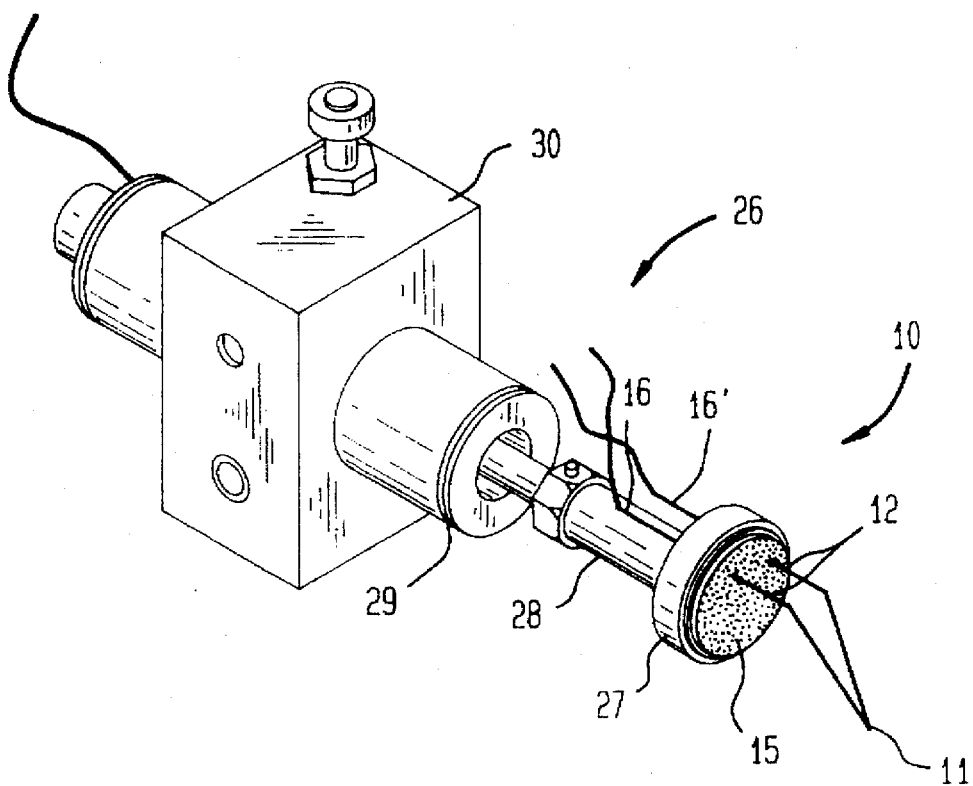
FIG. 4 is a schematic diagram showing the pen/piezo device assembly of the apparatus of FIG. 3.

FIG. 4 is a partial enlarged view of the pen/supporting frame assembly of FIG. 3. As apparent from FIG. 4, the tip 22 is disposed substantially obliquely, at about 45°, with respect to the horizontal plane. The two free ends of pins 16 and 16' emerge at the opposite sides of part 27 and are connected via wires to the power supply 33. Likewise, the piezo device 29 is also electrically connected to piezo control 32 via a single electrical wire.

The fine tip apex-to-substrate spacing distance adjustment can be controlled in a variety of manners. Manual adjustment can be performed by optical observation either directly or through a binocular or microscope. It can also be performed automatically based on the use of sensors sensitive to repulsive or attractive atomic/capillary forces, pressure, capacitance or line resistance measurements, and the like. Still assuming the material to be deposited is a metal, apparatus 20 may preferably also include an electrical continuity probing system. Two test probes are useful to perform electrical continuity or resistance measurements. In this instance, a master-slave system can be adapted to apparatus 20 so that, if the probing system detects any discontinuity (caused by a "skip" of the tip) during formation of a conductive line, the pen may resume the deposition process. The adaptation of a temperature controller, for more accurate control of the tip/heater assembly 14 temperature, e.g., by IR micro-pyrometry, is also within the purview of those skilled in the art.

According to the embodiment of FIG. 3, the tip/heater assembly 14, once connected to the power supply 33, maintains the material in a molten state, so that it continuously flows from the reservoir 19a, thereby wetting the tip surface with film 19b. However, other direct and indirect heating techniques of the reservoir, such as by electron and laser bombardment, induction, and the like are encompassed as well. No heating device is provided to heat the substrate 23. However, such a device could be easily adapted, if so required. Obviously, because of its simplified construction, the apparatus 20 of FIG. 3 could be fully automated.

Finally, it is also to be noted that the present apparatus is fully compatible with existing FIB-CVD stations. In this instance, if the apparatus is housed in the vacuum chamber of a scanning electron microscope or a FIB station, the SIM image, that provides an accurate control of the writing process is fully available. The apparatus 20 of FIG. 3 normally operates at room temperature. Moreover, it may also operate in an ambient atmosphere, if the tip refractory material is not destroyed in air when heated. However, under certain circumstances, e.g., deposition of Au-Si, this difficulty may be overcome if a neutral gas (nitrogen or argon) is blown, so that oxidation of the tip/heater assembly 14 is avoided (and contamination of the deposited Au-Si metal as well).

Figure 5:
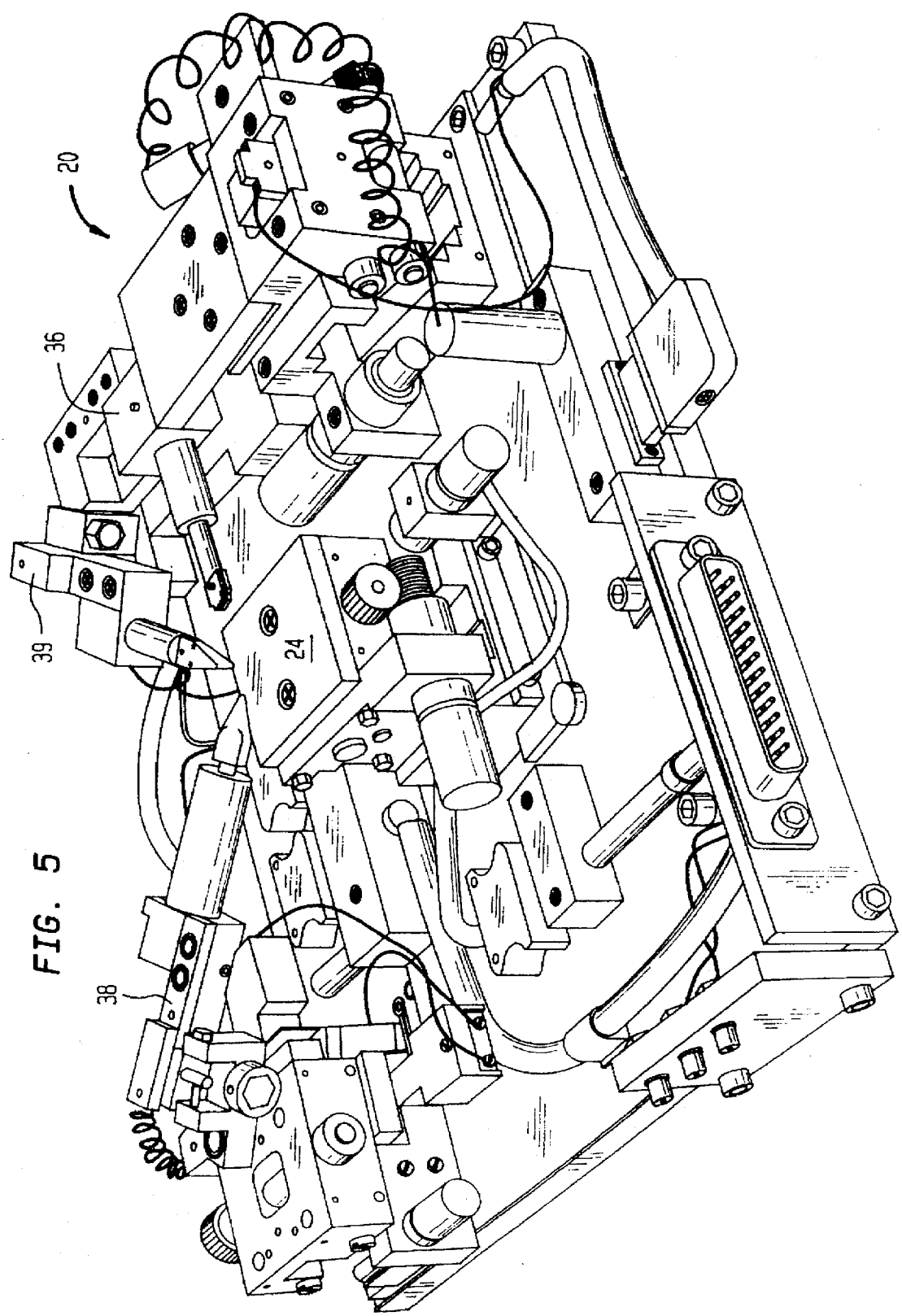
FIG. 5 is a photograph showing a perspective view of the experimental set-up of the apparatus of FIG. 3.

FIG. 5 is a photograph showing an experimental set-up of apparatus 20. The probing system mentioned above includes two probes 38 and 39 mounted on module blocks.

The deposition process will be now described in more detail. A typical technique of feeding the welding point 13 with liquid material is as follows. First, it is necessary to create a source of material in a molten state. By way of example, crucible 35 is filled with an ingot or pellets of the material to be deposited in vacuum chamber 20 (FIG. 3). The material 34 is heated above its melting point. Simultaneously, pen 10 and pins 16 and 16' (FIG. 1) are connected to power supply 33, so that an adequate current passes through, thereby resistively heating the tip/heater assembly 14. The temperature of the tip/heater assembly in the proximity of welding point 13 is raised above the melting point of the material. Its purpose is to prevent thermal shock therebetween. Next, the tip/heater assembly is dipped into the crucible. Reservoir 19a is filled and film 19b is created. Immediately after wetting the tip 11 with the film 19b, the apparatus is ready for use. In case the pen was previously used (pre-filled reservoir), i.e., wherein the material forming the reservoir and the film are solidified, it suffices to heat the tip/heater assembly as explained above to achieve the same result. The wetted tip 11 carried by supporting frame 26, being in the "up" position, is moved along X and/or Y directions and is positioned to be just above the initial deposition point. The supporting frame is moved either manually with a micromanipulator or automatically via control 31. The tip is coarsely adjusted above the substrate, e.g., at approximately 1 mm, in the Z direction using the Z stepping motor. A fine adjustment is then performed with the piezo device (still in the Z direction) until the film of liquid material coating the tip comes in contact with the substrate surface. This fine Z movement is completed under control of piezo control means 32 (FIG. 3). For the rest of the deposition process, it is convenient (essentially to avoid defocusing the SIM image), to move the substrate only by actuating the X-Y stage under the direction of control 31. Those skilled in the art will readily appreciate that what is intended are appropriate relative X, Y, and Z movements between the tip and the substrate.

Figure 6:
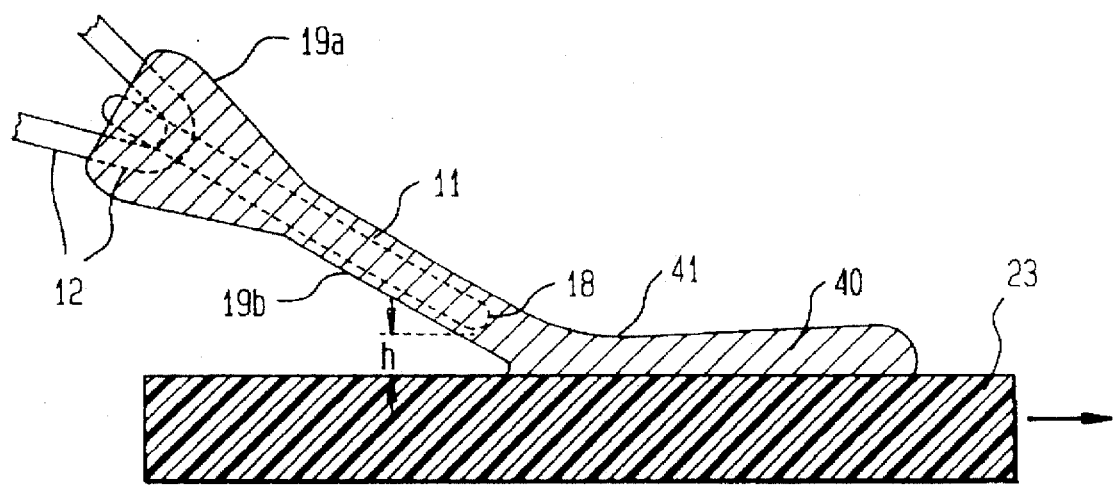
FIG. 6 is a schematic diagram to illustrate the direct writing method of the present invention when applied to the formation of a fine line onto the substrate.

Referring now to FIG. 6, the molten material flows (by action of capillary forces) from film 19b wetting the tip 11 onto the surface of the substrate 23, solidifying thereon. A fine line 40 of material is formed as soon as the substrate 23 is moved in the X and/or Y direction. A typical location of the liquid/solid interface front is labelled 41. The relatively high accuracy movement between tip and substrate (mechanical/piezo) allows placing the wetted apex of the tip at the appropriate spacing distance h to imitate the deposition process. In essence, the molten material flows from the tip, wets the substrate surface and solidifies thereupon. The method described in conjunction with FIG. 6 finds direct application in the formation of ultra-fine conductive lines to meet the interconnection requirements of VLSI IC chips. However, the present method is capable of forming other patterns and creating metal test pads (e.g., by multiple scanning, if the described pointed tip is used, or by using a doctor-blade tip). It is to be noted that the method of the present invention is also capable of fabricating dendritic like structures and bridge-shaped conductors.

As soon as the substrate is moved, line 40 is formed with an excellent adherence therewith. Note that, as apparent from FIG. 6, it is not necessary to have the apex of tip 11 brought into physical contact with the substrate surface. As a result, tip apex wear is significantly limited and a long usage of the tip is expected.

As mentioned above, according to another significant feature of the present invention, a vibratory movement can be applied to the tip to facilitate deposition at the initial point, and which can be maintained throughout the deposition process, if so desired. In some instances, the substrate acts as a heat-sink and thus cools the liquid material at the apex of the tip. This is particularly true when a metallic substrate is used (for instance, when a conductive land must contact a metallic pad, as illustrated in EXAMPLE 1 below). In this case, the interface front 41 of FIG. 6 tends to move towards the apex of the tip, making the deposition process more difficult. The role of the vibratory movement is to prevent solidification of the molten material at the contacting point. The high accuracy of the combined X-Y movements of stage 24 with the Z movement provided by the piezo device 29 allows depositing material without damaging the substrate 23. It is also possible to use the vibratory movement of tip 11 to overcome a "micro-stair" or to fill a via-hole. As a result, still assuming the deposition of a metal, it is possible to make conductive lines and studs in the Z direction, thereby opening the feasibility of fabricating a 3-D structure.

EXAMPLE 1

According to a further significant feature of the present invention, when metal is deposited on a metallic substrate, a current generator may be connected between the tip/heater assembly and the metallic pad (which must be grounded), to significantly improve the deposition process. The DC current which is superposed to the DC heating current supplied by power supply 33 produces micro-discharges which, in turn, cause the formation of small metal dots having excellent adherence. These dots can be overlapped to create a conductor. As a result, the pen of the present invention is readily adaptable to the micro-arc welding technique.

Finally, the deposition process is usually achieved at room temperature. The deposition rate should be tuned to yield a continuous deposition. Generally, speeds in the range of 20 µm/s are appropriate, but they obviously depend of the substrate surface quality and the specific application involved.

According to the present invention, the principle of deposition can thus be compared to the microscopic reproduction of writing with an ink pen on a plate, wherein the pen consists of a sharpened and roughened refractory metal-tip, and ink is replaced with material in a molten state.

Figure 7:
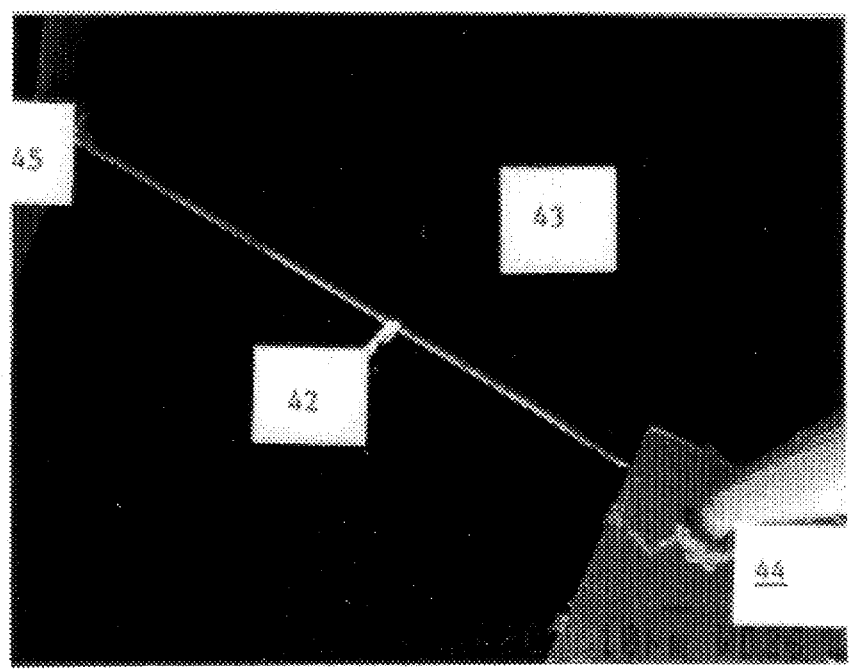
FIG. 7 is a photograph that illustrates the direct writing method of the present invention when applied to the formation of a metal connecting strap or land onto a polyimide sheet.

Au-Si metal alloy fine lines are deposited to form a conductive strap or land 42 on the surface of the substrate, in this instance, a polyimide sheet 43 having two square-shaped gold pads 44 and 45, as illustrated in FIG. 7. Operating parameters are: a heating DC current of about 0.7 A flowing into the heater 12 to raise the temperature to just above the Au-Si melting point, i.e., about 350° C. As soon as the film 19b is formed, the wetted tip 11 is gently brought into contact with pad 44 (the tip apex to pad surface spacing distance is a few nanometers). The tip vibrates in the Z direction to ensure good adherence of the Au-Si metal alloy on the gold pad. Next, the polyimide sheet 43 begins appropriate movements in the X and/or Y direction. As apparent from FIG. 7, the obstacle formed by the "micro-stair" at the pad 44 sidewall is properly overcome with no electrical discontinuity between the two pads. The speed, frequency and magnitude of the vibration are adjusted according to the interaction between the deposited Au-Si and the polyimide sheet. In this case, the speed deposition is about 5 µm/s, the vibration amplitude, 0.5 µm and the frequency, 20 Hz. The land 42 that is obtained has a cross-section of about 3 µm×3 µm. Once the "micro-stair" is overcome, the deposition proceeds onto the polyimide sheet 41, and the vibration of the tip is no longer a mandatory requirement. The deposition method described by reference to EXAMPLE 1 demonstrates that the direct writing method of the present invention is not limited to substrates having planar surface, but applies as well to irregular surfaces.

Figure 8:
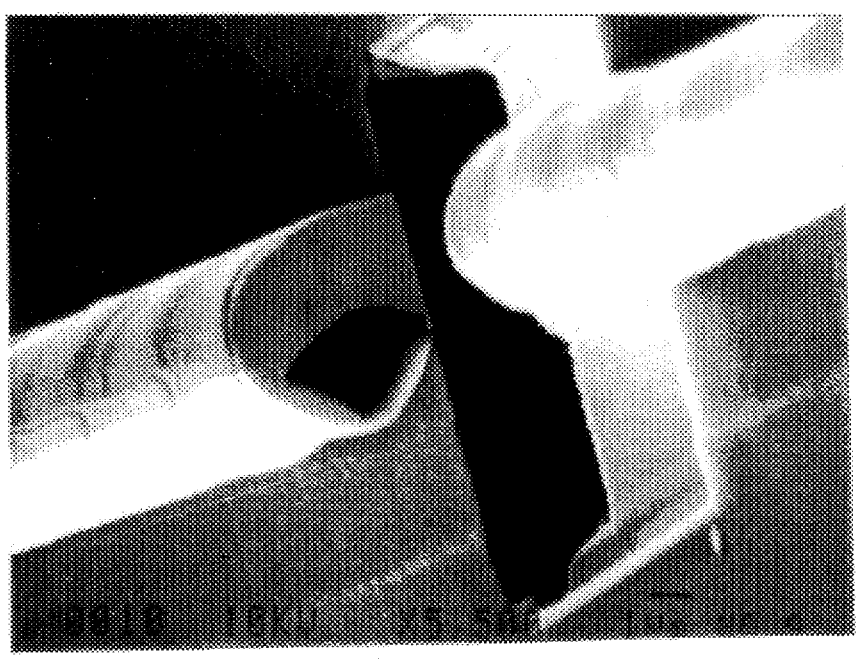
FIG. 8 is a photograph showing an enlarged cross-section of the metal connecting land of FIG. 7, illustrating the typical tapered edges and rounded corners thereof.

As apparent from FIG. 8, it is shown that a cross-section view of land 42 of FIG. 7, whose edges or sidewalls are tapered and the corners thereof rounded. The method of the present invention may be used to improve the topology of metal lines or conductors. It is particularly attractive when applied to refractory metallization. Moreover, the land section and the neat aspect of the Au-Si alloy/polyimide sheet interface are good indicators of the excellent adherence of the land forming metal with the polyimide sheet.

Figure 9:
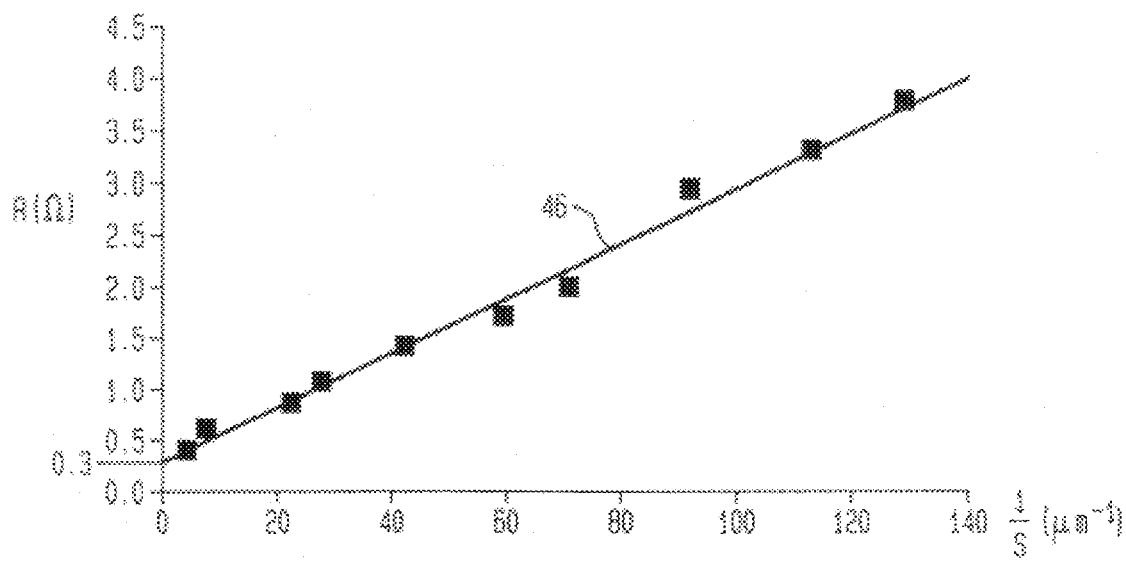
FIG. 9 is a plot of the resistance (in ohms) of the metal connecting land of FIG. 7, as a function of its length/surface ratio (in $\mu m^{-1}$)

Now referring again to FIG. 7, the measured resistance is 0.2 ohms between pads 44 and 45 that are spaced at about 180 μm apart. FIG. 9 is a plot of the measured resistance R (in ohms) versus the land length, more exactly the land length/land section ratio, i.e., 1/s (in $\mu m^{-1}$). Graph 46 which averages the various measured points has a slope which is illustrative of the resistivity of the deposited Au-Si. It is apparent from FIG. 9, that the resistivity of the deposited Au-Si is substantially identical to that of the bulk Au-Si metal alloy (2.6 $10^{-6}$ ohms-cm).

EXAMPLE 2

Figure 10:
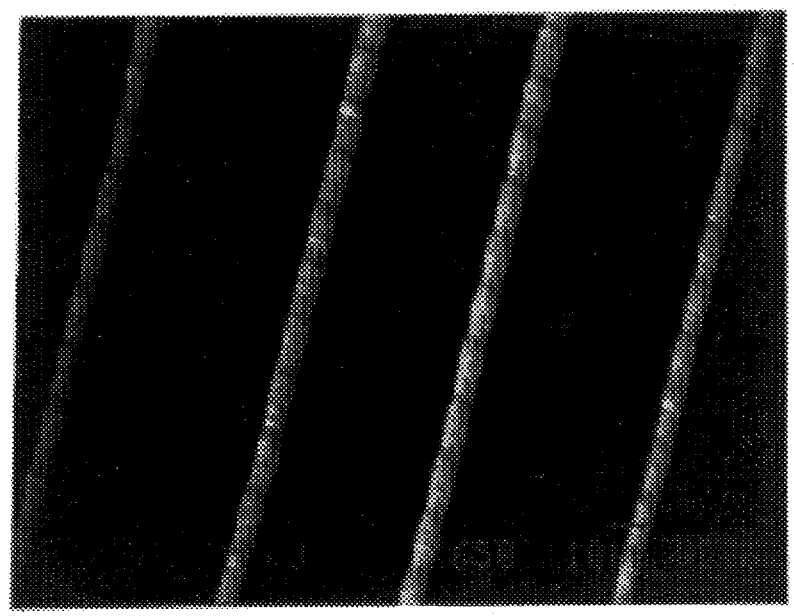
FIG. 10 is a photograph showing a pattern of parallel metal conductive lines formed onto an $SiO_2$ insulating substrate, according to the teaching of the present invention.

FIG. 10 is a photograph of a pattern of fine parallel Au-Si lines that were obtained on an $SiO_2$ substrate at a deposition speed of 10 μm/s according the method of the present invention. The lines are spaced at about 40 μm and have a cross-section 5 μm wide by 2 μm high. Various conductive materials including metals, metal alloys (Al-Si, Au-Si, Cu, ...) and refractory metals (Ta, Ti, ...) can be deposited, except tungsten (W) which forms the tip/heater assembly. However, non-conductive materials such as non-organic insulators ($Si_3N_4$, $SiO_2$, ...) or organic insulators (polymers) can be deposited as well when they have appropriate wetting and viscosity/fluidity characteristics. Deposition of other materials foreign to the semiconductor technology field is also possible. These materials include molten salts, resists, solutions, biological molecules and structures, etc. Depending on the material to be deposited, it may be required either to heat or to cool the substrate. Moreover, the substrate may be of any type of material but it is not restricted to ceramics, quartz, glasses, semiconductors, such as Si and GaAs, insulating coatings, such as nitrides and oxides, polymers, such as polyimides, etc.

The tip 11, because of its specific pointed shape, may also be used for subtractive processes. Many applications require fine lines formed onto a substrate to be delineated by ablation. For instance:

A first conventional technique is mechanical scribing. Articles typically produced by mechanical scribing are reticle masks. A resistless process is thus sought in contrast with relatively expensive fine line lithographic techniques developed for IC chip fabrication. In this respect, mechanical scribing technique is characterized by a lower capital and operating cost, but some doubts remain on its ability of scribing ultra fine lines (e.g., 0.35 μm) that are required to fabricate the photomasks for advance IC chip designs. Tip 11 of the present invention can easily be adapted for use in mechanical scribing. It is much more efficient, because the piezo device 29 provides additional destructive capabilities (power-hammer effect) that cannot be attained with standard tips.

The mechanical scribing technique described above uses a pointed piece of a solid material, in this instance, tip 11, to shape a workpiece. Conductive materials can also be shaped by electromachining processes such as electric discharge machining (EDM) and, in particular, by electro erosion machining. In this case, the workpiece is grounded and an arc is struck between an electrode and the workpiece. If the workpiece is a good conductor, the /arc forms a plasma which vaporizes the material of the workpiece, in the vicinity of the arc. Reasonable control of the material removal is possible through arc control. A technique of drilling micro holes in various workpieces, such as reticle masks, is described in U.S. Pat. No. 5,149,404.

In a typical application, tip 11, which plays the role of an electrode, is held in close proximity to or contacting the workpiece to be scribed. The pins 16 and 16' are shorted and connected to a terminal of an electric power supply, the workpiece being connected to the other via a switch. The tip is placed in contact or near contact with the workpiece by either gravity or some other force such as that provided by a system of a spring. The contact force, if so required, depends on the specific application. When the power supply is switched on, the tip and the workpiece are translated with respect to each other, and scribing takes place. The pen of the present invention may thus find another range of applications, for instance, in the fabrication and repair of photomasks.

In summary, the method of the present invention exhibit many advantages. The method is adequate for deposition of various materials on a variety of substrates. Conductive materials, such as metals, non conductive materials, such as semiconductors or superconductors, can be deposited. Refractory metals can be deposited, except tungsten which is the preferred material forming the tip/heater assembly. The substrate surface need not be planar.

The tip is prevented from premature wear, because no physical contact with the substrate is required. As an additional result, the present method does not harm the substrate surface, unlike standard FIB-CVD deposition techniques, which require a high dose of ions.

The piezo device may reveal to be a determining feature in certain cases, such as to initiate a deposition process and to fill via-holes. Moreover, the piezo device may be combined with a current generator to produce micro discharges for improved adherence of the deposited metal on a metallic substrate.

The deposition process is Of the direct type. A metal connection line (e.g., 2 μm×1 μm section) can be deposited at a speed of tens of μm/s. In addition, the resistivity of the deposited metal is equal to the resistivity of the bulk metal to be deposited. As a result, it is easy to establish relatively long conductive lines to form the conductors of IC chips, e.g., several hundred of microns. Moreover, the lines have the desired tapered edges.

The deposition process is highly accurate. For instance, the high resolution of the method of the present invention allows filling an open between two ultra-fine conductive lines with minimal spacing, for instance, two 0.3 μm wide lines spaced at about 0.3 μm.

The deposition of metals is achieved without toxic gas or compound, usually at room temperature and at ambient atmosphere.

A number of different tip shapes and sizes may be used to produce a great variety of patterns. The apparatus of the present invention is of simple construction and has low operating costs compared with the FIB-CVD stations.

It is easily adaptable to some subtractive processes, such as mechanical scribing and electroerosion machining.

As a consequence, the method of the present invention finds a wide range of applications.

Firstly, the capability of forming highly conductive fine lines of metals is an important feature for customizing and repairing IC chips. However, resistors, instead of highly conductive lines can be deposited as well, should appropriate compositions be used, such as cermets. On the other hand, the capability of forming large zones of an opaque material is useful in the fabrication and repair of photomasks. Next, the capability of filling via-holes (stud forming process) to deposit metal on the side of devices, and to deposit insulator on limited zones of a device, is a determining factor in the fabrication of 3D structure. Finally, the capability of depositing insulators may also be used to form small isolation regions and connections for optical fibers for instance, if molten glass is used as the deposited material.

Other applications include: fabrication of hybrid circuits, diffraction gratings, solar cells, quantum devices and the like.

In particular, the method of the present invention appear to be perfectly adapted to the fabrication of solar cells. Multiple adjacent pens may be easily combined with a ribbon of silicon transported by a continuously moving belt for inexpensive mass production of the same.

This method appears to be highly useful for failure analysis (pad forming process), sample preparation, microanalysis, reconfiguration of IC chips and the like.

Moreover, the IC chip and mask repair can be integrated into quality control cycles in which any defects in the patterns originally deposited are corrected as soon as the manufacture of the IC chip or mask is completed. Therefore, it may prove worthwhile to have the apparatus of the present invention at key locations of the manufacturing line.

Another unique benefit of the method and apparatus of the present invention is its compatibility with other FIB techniques, such as ion implantation and ion milling or reverse sputtering, so that the integration of the metal deposition technique of the present invention would make possible an integrated, completely mask-free IC chip fabrication system.

What is claimed is:

1. A method for depositing a continuous line of material on a surface of a substrate comprising the steps of:
   a) providing a tip having an apex at one end and a source of said material in a molten state at an opposite end of said tip, said material being brought to the molten state by a source of heating current;
   b) providing a film of said molten material to an outside surface of said source, said molten material flowing towards said apex to provide a continuous flow of said molten material;
   c) applying electrical discharges to said tip by providing a DC current which is superposed to said heating current; and
   d) dragging said apex across said surface of said substrate, thereby forming said continuous line of material on said surface of said substrate.

2. The method of claim 1 further comprising the step of applying a vibratory movement to the tip.

3. The method of claim 1 wherein said material to be deposited is electrically conductive.

4. The method of claim 3 wherein said conductive material is selected from the group that consists of Al, Au, Cu, Si, Ta, Ti, and alloys thereof.

5. The method of claim 1 wherein said substrate is selected from the group that consists of a semiconductor wafer substrate, a multi-layer ceramic substrate and a metalized ceramic substrate.

6. The method of claim 1 wherein the tip is made of a refractory metal.

7. A method for depositing a continuous line of material onto the surface of a substrate comprising the steps of:

providing a tip having an apex, said tip being attached to a source of said material in a molten state, said material being brought to the molten state by a source of heating current, said molten material being deposited onto the surface of said substrate;

applying electrical discharges to said tip by providing a DC current which is superposed to said heating current;

controlling a movement between said substrate and said tip, maintaining said apex at a distance from said surface of said substrate; and dragging said apex across said surface, said apex depositing said continuous line of said material, on said surface of said substrate.

8. The method of claim 7, further including the step of providing a substrate support for holding the substrate.

9. The method of claim 7, further including the step of vibrating the tip to draw the molten material towards the apex.

10. The method of claim 7, further comprising the step of heating said tip, wherein heating the tip is performed by a resistive heating element.

11. The method of claim 7, wherein said source of said material in a molten state is a crucible.

12. The method of claim 7, wherein the tip includes a tip support for supporting the tip above the surface of the substrate.

13. The method of claim 7, wherein the molten material that nucleates is deposited unto the substrate by gravity.

14. The method of claim 7, wherein the molten material to be deposited forms a reservoir that wets the tip, when the material is heated.

15. The method of claim 7, wherein said substrate is selected from the group that consists of a semiconductor wafer substrate, a multi-layer ceramic substrate and a metalized ceramic substrate.

16. The method of claim 7, wherein the tip is made of a refractory metal.

17. The method of claim 7, wherein said tip has a diameter ranging from 0.5 µm to 1,000 µm.

18. The method of claim 7, wherein said substrate has metalized pads, and wherein a current generator is coupled between said metalized pads and said tip to speed said deposition of said continuous line of said material on said substrate.

* * * * *